(12) United States Patent
Lo

(10) Patent No.: US 7,299,861 B2
(45) Date of Patent: Nov. 27, 2007

(54) WATER-COOLING HEAT EXCHANGER AND HEAT-DISSIPATING DEVICE FOR THE SAME

(75) Inventor: Lieh-Feng Lo, Chung-Ho (TW)

(73) Assignee: Cooler Master Co., Ltd., Taipei (TW)

( * ) Notice: Subject to any disclaimer, the term of this patent is extended or adjusted under 35 U.S.C. 154(b) by 135 days.

(21) Appl. No.: 11/331,208

(22) Filed: Jan. 13, 2006

(65) Prior Publication Data
US 2006/0237172 A1  Oct. 26, 2006

(30) Foreign Application Priority Data
Apr. 22, 2005 (TW) .............................. 94206367 U

(51) Int. Cl.
*F28F 7/02* (2006.01)
(52) U.S. Cl. ...................... 165/125; 165/80.4
(58) Field of Classification Search ............... 165/125, 165/80.3, 80.4, 80.5; 361/698, 699; 257/714
See application file for complete search history.

(56) References Cited

U.S. PATENT DOCUMENTS

| | | | | |
|---|---|---|---|---|
| 4,202,296 A | * | 5/1980 | Nonnenmann et al. | 165/125 |
| 5,088,550 A | * | 2/1992 | Tippman et al. | 165/117 |
| 5,172,752 A | * | 12/1992 | Goetz, Jr. | 165/41 |
| 5,445,218 A | * | 8/1995 | Nieh | 165/125 |
| 6,582,035 B2 | * | 6/2003 | Lucht et al. | 312/138.1 |
| 6,666,261 B2 | * | 12/2003 | Yang et al. | 165/80.4 |
| 6,668,911 B2 | * | 12/2003 | Bingler | 165/80.4 |

FOREIGN PATENT DOCUMENTS

TW  M249099  11/2004

\* cited by examiner

*Primary Examiner*—Teresa J. Walberg

(57) ABSTRACT

A water-cooling heat exchanger and a heat-dissipating device are mounted on a heat-generating element of a computer for rapidly guiding and dissipating the heat generated by the heat-generating element. A water-cooling head, a pump and a heat-dissipating fan are stacked up, and an annular heat exchanger is used to surround the above components, thereby to reduce the space of the whole construction to a lowest extent. With the heat-dissipating fan provided in the center of the annular heat exchanger, the airflow generated by the heat-dissipating fan can blow the heat exchanger in multiple directions, thereby to obtain the optimal effect of heat dissipation.

5 Claims, 6 Drawing Sheets

# WATER-COOLING HEAT EXCHANGER AND HEAT-DISSIPATING DEVICE FOR THE SAME

BACKGROUND OF THE INVENTION

1. Field of the Invention

The present invention relates to a water-cooling heat exchanger and a heat-dissipating device for the same. In particular, the present invention relates to a heat-dissipating device mounted on a heat-generating element of a computer such that the heat generated by the heat-generating element can be rapidly dissipated.

2. Description of Related Art

In the past, the processing speed of the Central Processing Unit (CPU) of a computer is very slow. Thus, an air-cooling heat-dissipating device comprising heat-dissipating bodies and heat-dissipating fans is sufficient to carry out the heat dissipation. However, recently, the time clock of the CPU has exceeded 3 GHz. Further, the time clock is proportional to the heat. Therefore, the above heat-dissipating devices are limited by the space of the casing, and it is more and more difficult for the above heat-dissipating devices to keep pace with the improvements of the CPU, causing the insufficiency in heat dissipation. Further, when a heat-dissipating fan is rotating in high speed, the undesired noise generated by the rotating fan is intolerable to people. Therefore, it is an important issue to provide a water-cooling heat exchanger and the heat-dissipating device for the same having high heat-dissipating efficiency and low noise.

As disclosed in Taiwan Patent Certificate No. 249099, a conventional water-cooling heat exchanger and the heat-dissipating device for the same mainly comprise a water-cooling head, a water tank, a heat exchanger and a heat-dissipating fan. The interior of the water-cooling head is provided with a plurality of flowing paths. The front and rear ends of those flowing paths are connected to two conduits, respectively. The other end of one of the conduits is connected to a water tank. The interior of the water tank is provided with a pump. One end of the pump is connected to a delivering pipe. The delivering pipe and the other of the above conduits are collectively connected to both ends of the heat exchanger. One side of the heat exchanger is provided with a heat-dissipating fan. With the above elements, a water-cooling heat exchanger and the heat-dissipating device for the same can be obtained.

However, in the conventional water-cooling heat exchanger and the heat-dissipating device for the same, each element is separately provided with an interval thereabout. Thus, when the heat-dissipating device is mounted on a circuit board, it will occupy a large part of space, such that the volume of the whole structure becomes so bulky. As a result, such a bulky structure cannot conform to the requirements for modern electronic products that have a tendency to be compact in size and light in weight. Further, the heat-dissipating fan is provided on one side of the heat exchanger, and thus the heat-dissipating fan can only blow the heat exchanger in one direction, such that the efficiency in heat dissipation is insufficient. Moreover, when the heat-dissipating fan is rotating in high speed, the undesired noise generated by the rotating fan is intolerable to people. Each element for delivering the fluid has two joints for connecting to various conduits or delivering pipes. Most of the conduits and pipes are formed of flexible soft pipes made by plastic or rubber. After being used for a period of time, such kinds of conduits or pipes are liable to get hardened or cracked, such that the fluid containing in the pipes can be leaked from the cracks, causing the breakage of the electronic elements thereabout.

Therefore, in view of the above drawbacks of conventional art, the inventor of the present invention has proposed a novel and inventive structure based on his expert experiences and researches to overcome the above drawbacks.

SUMMARY OF THE INVENTION

The object of the present invention is to provide a water-cooling heat exchanger and a heat-dissipating device for the same, in which the heat exchanger is circumferentially provided on the outer periphery of the heat-dissipating fan and a heat-absorbing element. With such arrangement, the volume of the total structure and the noise generated by the rotating heat-dissipating fan can be greatly reduced. Further, the airflow generated by the heat-dissipating fan can be blown to the heat exchanger in multiple directions, causing the optimal effect of heat dissipation.

In order to achieve the above objects, the present invention provides a water-cooling heat exchanger and a heat-dissipating device for the same, wherein the heat-dissipating device is mounted on a heat-generating element of a computer and comprises:

a heat exchanger having a pump, a plurality of primary water paths and a plurality of auxiliary water paths, wherein the pump has an outlet pipe and an inlet pipe, the primary water paths are formed with an inlet and an outlet, the inlet is connected to the outlet pipe of the pump, the outlet is connected to the inlet pipe of the pump, the auxiliary water paths are provided between each primary water path, each auxiliary water path is separately provided with an interval thereabout, and the interval is formed with a plurality of heat-dissipating fins; and a heat-absorbing element provided underneath the pump of the heat exchanger, wherein a water path is formed between the heat-absorbing element and the pump for the fluid passing through, the water path is in fluid communication with the outlet pipe and inlet pipe, thereby to form a circulating route for the fluid passing through.

DETAILED DESCRIPTION OF THE INVENTION

The characteristics and technical contents of the present invention will be explained with reference to the following detailed description and accompanying drawings. It should be understood that the drawings are illustrative examples only, but not intended to limit the scope of the present invention.

Figure 1:
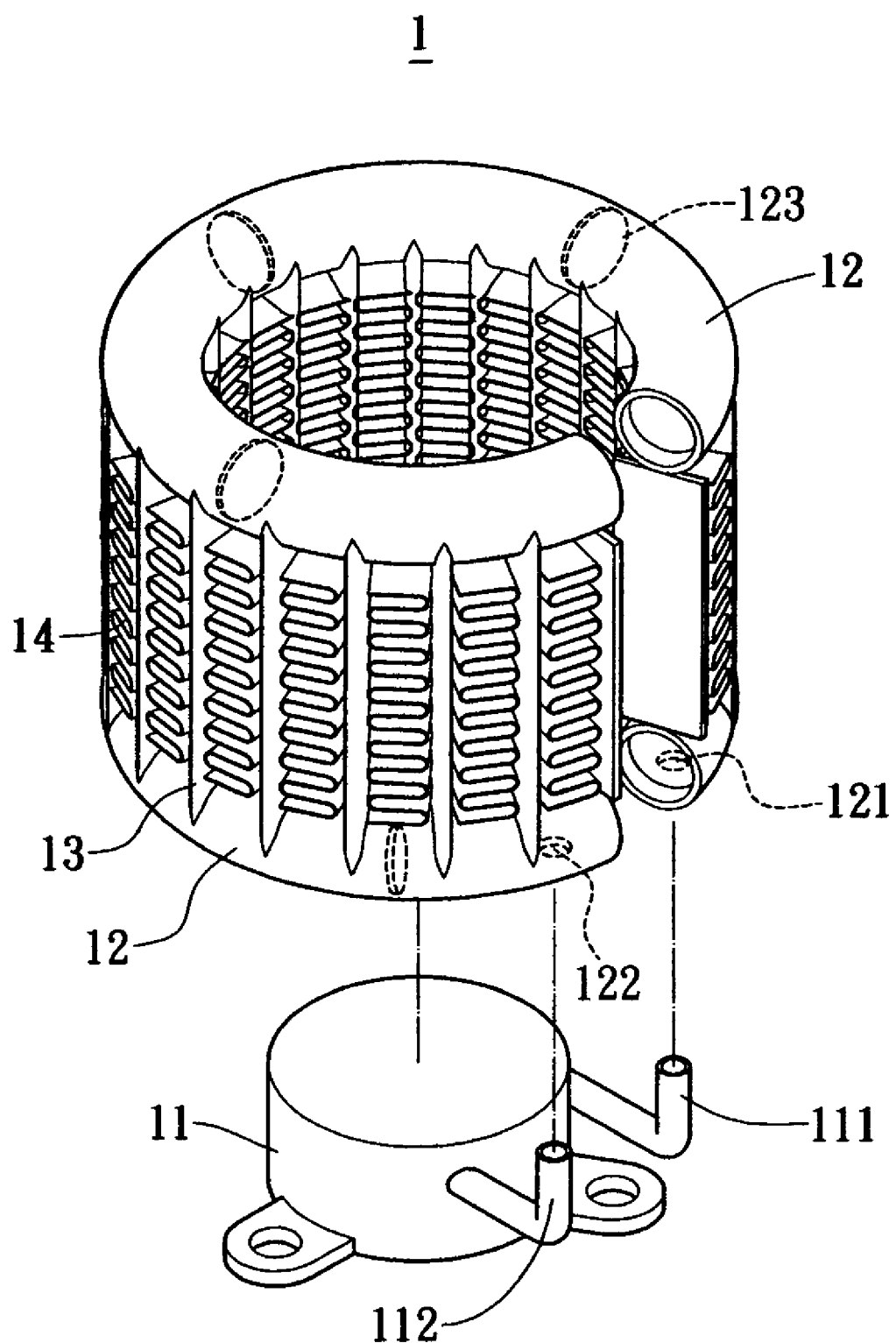
FIG. 1 is an exploded perspective view of the heat exchanger of the present invention.

FIG. 1 is an exploded perspective view of the heat exchanger of the present invention. The present invention provides a water-cooling heat exchanger and a heat-dissipating device for the same. The water-cooling heat exchanger 1 comprises a pump 11, a plurality of primary water paths 12 and a plurality of auxiliary water paths 13. The pump 11 has an outlet pipe 111 and an inlet pipe 112. Those primary water paths 12 and the auxiliary water paths 13 are formed into a near closed loop. The primary water paths 12 are formed with an inlet 121 and an outlet 122. The inlet 121 is connected to the outlet pipe 111 of the pump 11. The outlet 122 is connected to the inlet pipe 112 of the pump 11. Further, each primary water path 12 can be a circular pipe, a flat pipe or any other suitable geometric construction. In the present embodiment, circular pipes arranged horizontally are used. In the interior of those circular pipes, a plurality of partitions 123 are provided for guiding the water flow. The plurality of auxiliary water paths 13 are provided between each primary water paths 11. Similarly, each auxiliary water path 13 can be a circular pipe, a flat pipe or any other suitable geometric construction. In the present embodiment, flat pipes arranged vertically are used. Each auxiliary water path 13 is separately arranged with an interval thereabout, and a plurality of heat-dissipating fans 14 are formed in the interval. Each heat-dissipating fin 14 can be shaped into a single piece, a waved piece or the combination of the above two forms.

Figure 2:
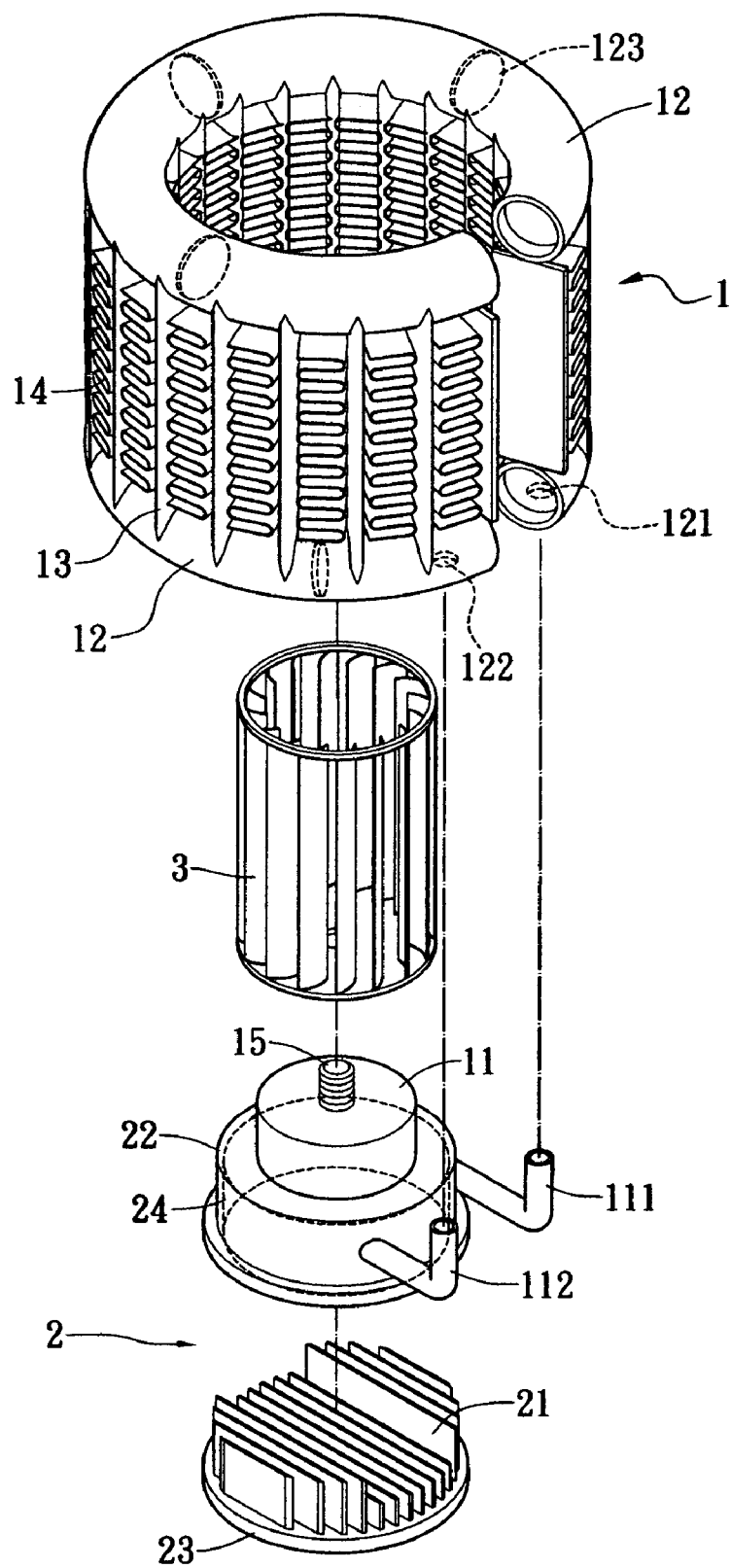
FIG. 2 is an exploded perspective view of the heat-dissipating device of the present invention.
Figure 3:
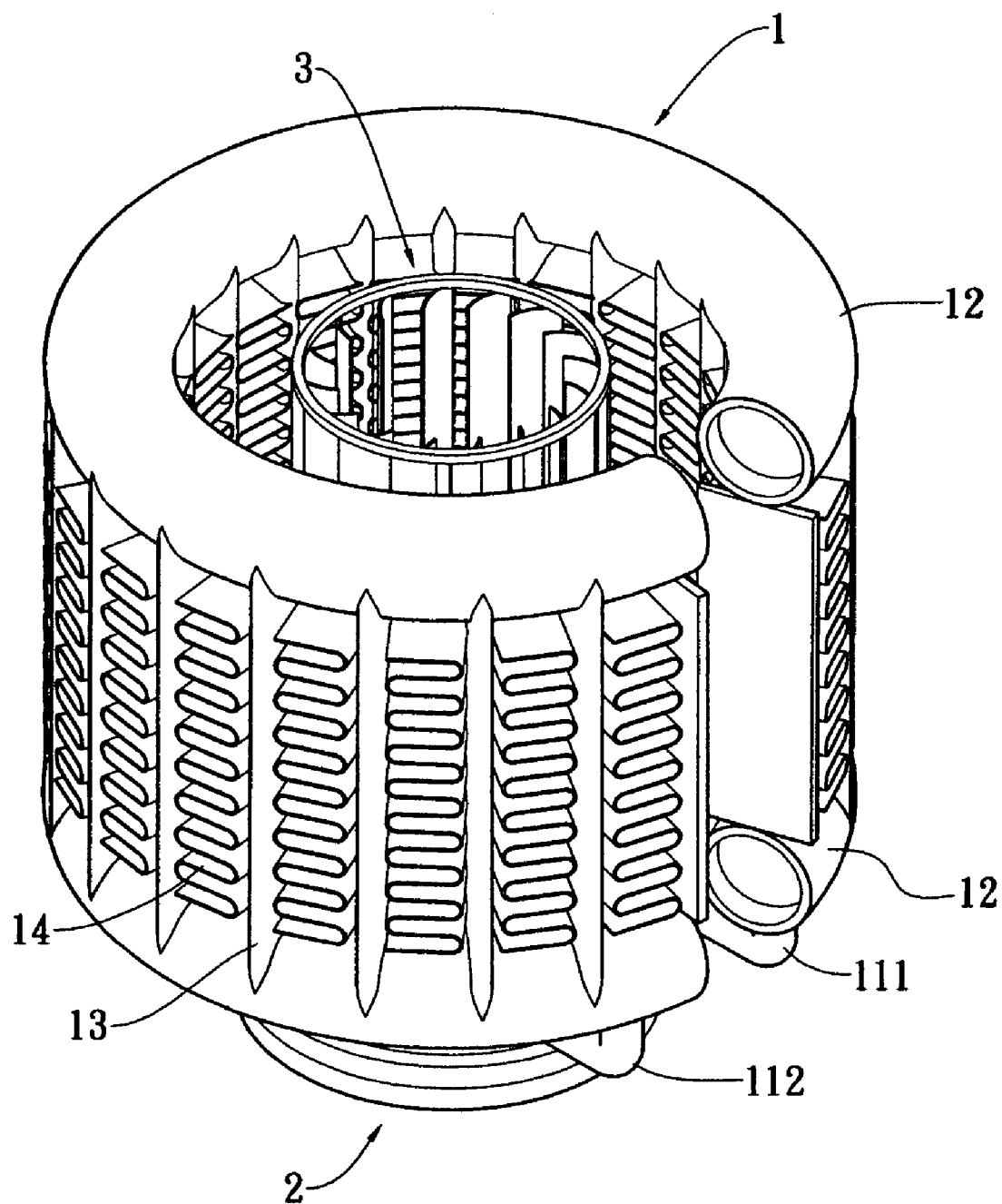
FIG. 3 is a schematic view showing the assembling of the heat-dissipating device of the present invention.
Figure 4:
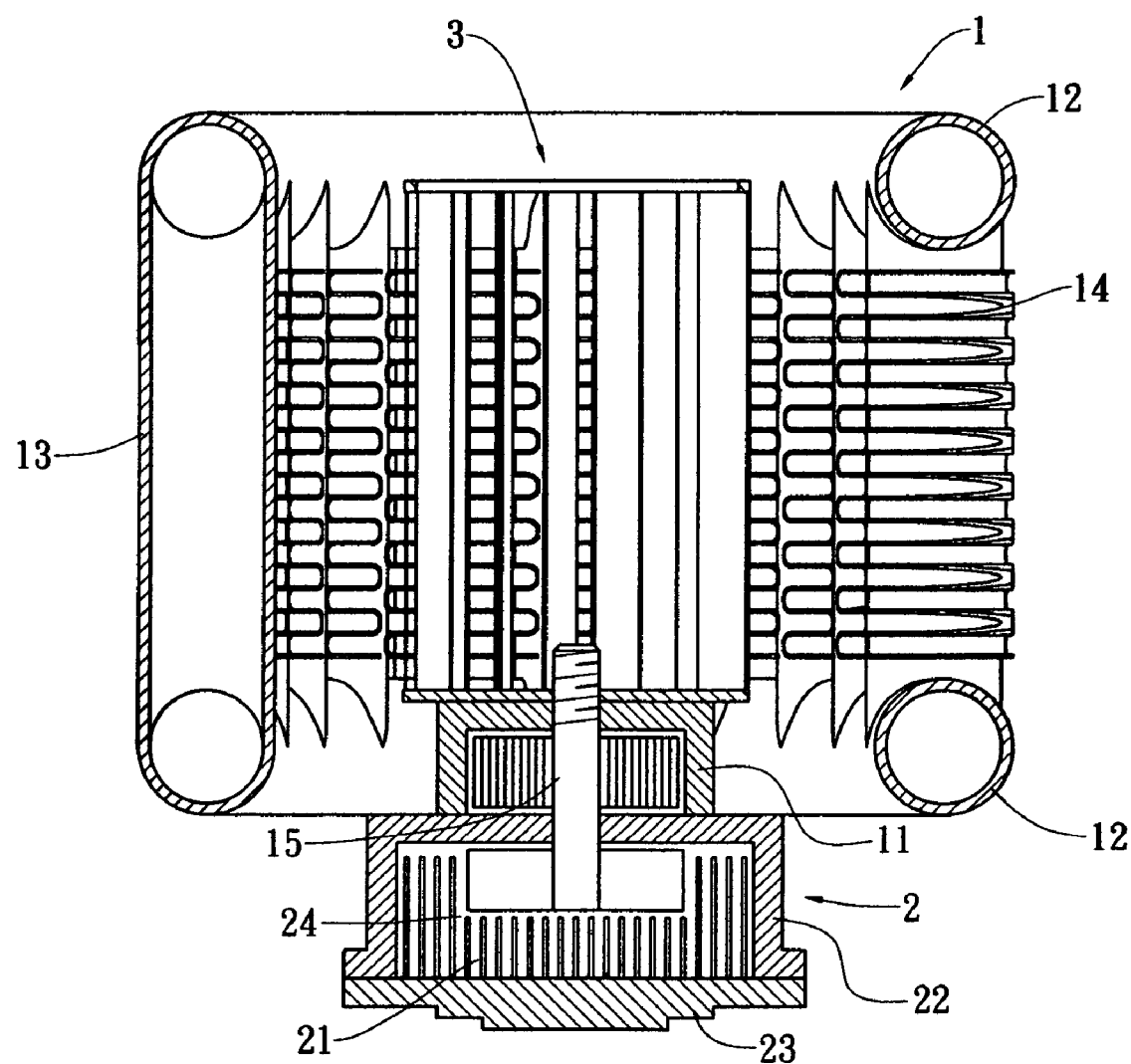
FIG. 4 is a cross-sectional view showing the assembling of the heat-dissipating device of the present invention.

With reference to FIGS. 2, 3 and 4, FIG. 2 is an exploded perspective view of the heat-dissipating device of the present invention, FIG. 3 is a schematic view showing the assembling of the heat-dissipating device of the present invention, and FIG. 4 is a cross-sectional view showing the assembling of the heat-dissipating device of the present invention. The heat-dissipating device mainly comprises the above heat exchanger 1 and a heat-absorbing element 2. The heat-absorbing element 2 is a water-cooling head arranged underneath the pump 11 of the heat exchanger 1 and surrounded by each primary water path 12 and auxiliary water path 13. A water path 21 is formed between the heat-absorbing element 2 and the pump 11 for a fluid passing through. The water path 21 is in communication with the outlet pipe 111 and the inlet pipe 112.

The heat-absorbing element 2 of the present embodiment and the pump 11 can be provided in a common casing. The heat-absorbing element 2 comprises a cover 22 and a base 23 connected to the cover 22. An Accommodating space 24 and the aforesaid water path 21 are formed between the cover 22 and the base 23. The accommodating space 24 is provided therein with blades of the pump 11. The front and rear ends of the water path 21 are connected to the outlet pipe 111 and the inlet pipe 112 of the pump 11, respectively.

Further, the heat-dissipating device of the present invention comprises a heat-dissipating fan 3 arranged above the pump 11 of the heat exchanger 1 and surrounded by each primary water path 12 and auxiliary water path 13. The pump 11 and the heat-dissipating fan 3 can be activated by a common rotating shaft 15.

Figure 5:
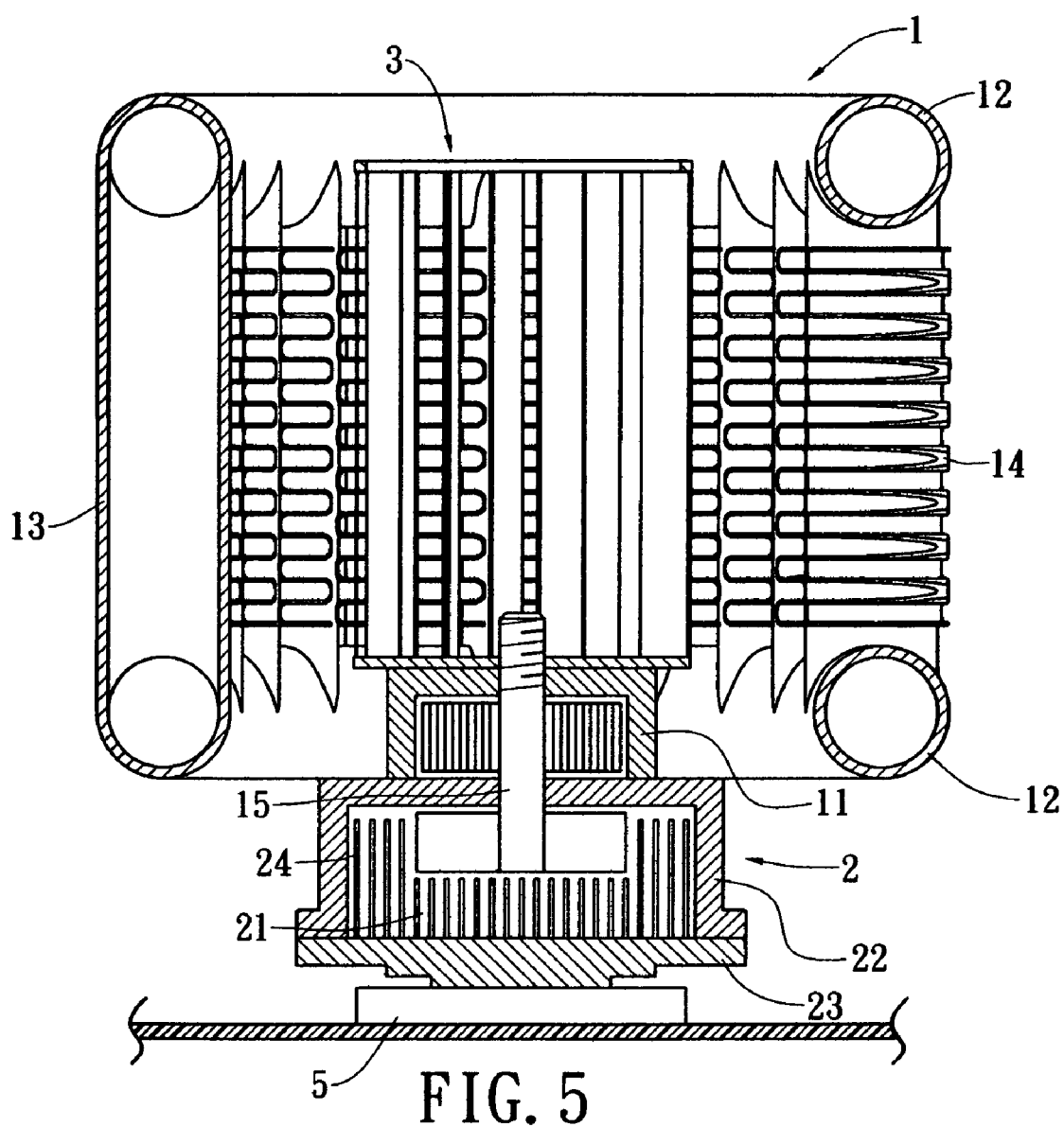
FIG. 5 is a view showing a state in which the heat-dissipating device of the present invention is applied to a CPU.

FIG. 5 is a view showing a state in which the heat-dissipating device of the present invention is applied to the heat-generating element. With the arrangement of the above elements, the heat-dissipating device can be mounted on a heat-generating element 5. First, a heat-conductive medium (no shown) is applied to the underside of the base 23 of the heat-absorbing element 2. Then, the base is arranged to abut against the top surface of the heat-generating element 5. The heat generated by the heat-generating element 5 can be absorbed by the fluid containing in the heat-absorbing element 2. With the rotation of the pump 11, the fluid flows through the water path 21 of the heat-absorbing element 2 and exits via the outlet pipe 111. Further, the fluid flows through the primary water paths 12 and auxiliary water paths 13. With the heat-dissipating fins abutting against the auxiliary water paths 13, the heat can be conducted to the heat-dissipating fins 14. At the same time, with the airflow generated by the heat-dissipating fan 3, the heat of the heat-dissipating fins 14 can be effectively dissipated. When the fluid flows back to the heat-absorbing element 2 at the inlet pipe 112, the temperature of the fluid has been sufficiently reduced. With the above arrangement, an optimal effect of heat dissipation can be obtained.

Figure 6:
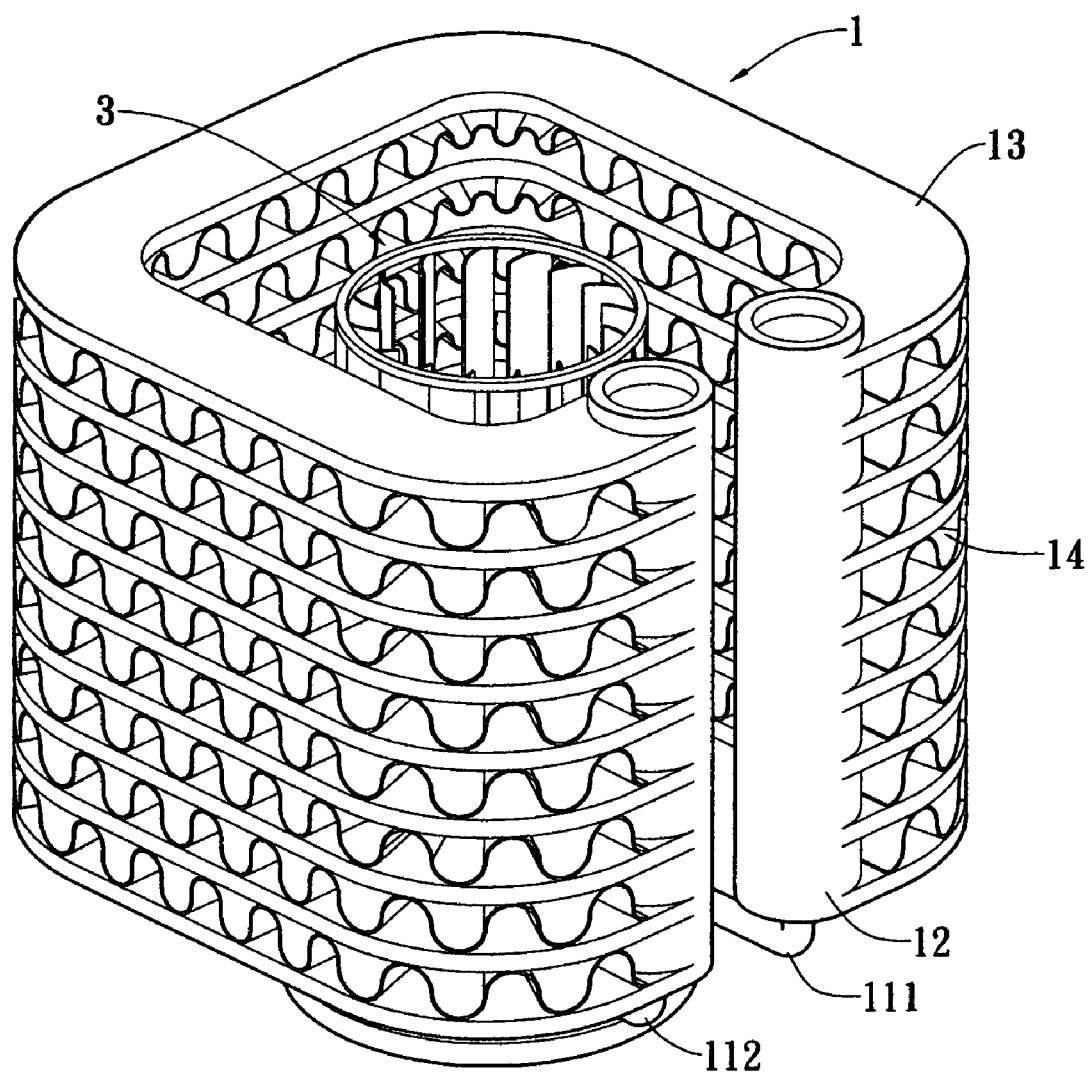
FIG. 6 is a schematic view showing another embodiment of the heat-dissipating device of the present invention.

FIG. 6 is a schematic view showing another embodiment of the heat-dissipating device of the present invention. In addition to the circular pipes arranged horizontally as used in the above embodiment, in this embodiment, the primary water paths 12 of the present invention can be tubular pipes arranged vertically, and the auxiliary water paths 13 can be flat pipes arranged horizontally, thereby to make the heat-dissipating device has a longer route for dissipating heat.

According to the above, the water-cooling heat exchanger and a heat-dissipating device for the same of the present invention indeed have industrial applicability, novelty and inventive steps. Since the construction of the present invention has not been published or put to public use prior to applying for patent, the present invention conforms to the requirements for a utility model patent.

Although the present invention has been described with reference to the foregoing preferred embodiments, it will be understood that the invention is not limited to the details thereof. Various equivalent variations and modifications can still be occurred to those skilled in this art in view of the teachings of the present invention. Thus, all such variations and equivalent modifications are also embraced within the scope of the invention as defined in the appended claims.

What is claimed is:

1. A water-cooling heat-dissipating device, comprising:
    a heat exchanger comprising a pump, a plurality of primary water paths and a plurality of auxiliary water paths, wherein the pump has an outlet pipe and an inlet pipe, the primary water paths are formed with an inlet and an outlet, the inlet is connected to the outlet pipe of the pump, the outlet is connected to the inlet pipe of the pump, the plurality of auxiliary water paths are formed between each primary water path, each auxiliary water path is separately arranged with an interval thereabout, and a plurality of heat-dissipating fins are formed in the interval; and
    a heat-absorbing element provided underneath the pump of the heat exchanger, wherein a water path is formed between the heat-absorbing element and the pump for a fluid passing through, the water path is in communication with the outlet pipe and the inlet pipe, thereby to form a circulating route for the fluid passing through.

2. The water-cooling heat-dissipating device according to claim 1, wherein the heat-absorbing element is circumferentially surrounded by each primary water path and auxiliary water path.

3. The water-cooling heat-dissipating device according to claim 2, wherein the heat-absorbing element is a water-cooling head.

4. The water-cooling heat-dissipating device according to claim 1, further comprising a heat-dissipating fan arranged above the pump of the heat exchanger and surrounded by each primary water path and auxiliary water path.

5. The water-cooling heat-dissipating device according to claim 4, wherein the pump and the heat-dissipating fan are adapted to be activated by a common rotating shaft.

* * * * *